United States Patent [19]

Imamura et al.

[11] Patent Number: 4,855,798

[45] Date of Patent: Aug. 8, 1989

[54] SEMICONDUCTOR AND PROCESS OF FABRICATION THEREOF

[75] Inventors: Youichiro Imamura; Toshiyuki Kaeriyama; Hironori Ishimoto, all of Miho, Japan

[73] Assignee: Texas Instruments Incorporated, Dallas, Tex.

[21] Appl. No.: 284,860

[22] Filed: Dec. 13, 1988

Related U.S. Application Data

[63] Continuation of Ser. No. 944,387, Dec. 19, 1986, abandoned.

[51] Int. Cl.[4] .................... H01L 23/48; H01L 29/44; H01L 29/54; H01L 29/62
[52] U.S. Cl. ....................... 357/71; 357/34; 357/59; 156/628; 148/175; 29/576 E; 29/578; 29/591
[58] Field of Search ............. 357/71, 34, 59; 29/576 E, 578, 591; 148/175; 156/628

[56] References Cited

U.S. PATENT DOCUMENTS

| | | | |
|---|---|---|---|
| 4,408,387 | 10/1983 | Kiriseko | 357/34 |
| 4,545,116 | 10/1985 | Lau | 29/591 |
| 4,551,911 | 11/1985 | Sasaki et al. | 357/34 |

Primary Examiner—Robert S. Macon
Attorney, Agent, or Firm—William E. Hiller; N. Rhys Merrett; Melvin Sharp

[57] ABSTRACT

A semiconductor device having a salicide (self-aligned silicide) configuration and operable as, for example, a dynamic RAM device is fabricated by preparing a semiconductor substrate, forming a layer of silicon in, on or over the semiconductor substrate, forming a layer of a metal on the layer of silicon, the metal silicide layer having a surface portion, and heating the resultant structure in the presence of a reaction ambient containing nitride for forming on the layer of silicon a layer of a metal silicide having a surface portion and nitriding the surface portion to form a nitride layer consisting of a nitride of said metal silicide.

15 Claims, 5 Drawing Sheets

PRIOR ART

SEMICONDUCTOR AND PROCESS OF FABRICATION THEREOF

This application is a continuation of application Ser. No. 944,387 filed Dec. 19, 1986, now abandoned.

FIELD OF THE INVENTION

The present invention relates to a semiconductor device and to a process of fabricating the semiconductor device. More particularly, the present invention relates to a semiconductor device having a self-aligned silicide region and to a process of fabricating such a semiconductor device.

BACKGROUND OF THE INVENTION

A semiconductor device such as typically a MOSFET (metal-oxide-semiconductor field-effect transistor) implementing a memory cell of a d-RAM (dynamic random-access memory) device is often fabricated using a process known as salicide or self-aligned silicide process. In this salicide process, a self-aligned silicide layer of a refractory metal such as titanium is formed selectively on the polysilicon gate and the doped source/-drain regions of a semiconductor substrate. Semiconductor devices having such salicide configuration are expected to provide faster speeds and higher integration densities. There are however some problems inherent in semiconductor devices of this nature. As will be discussed in more detail, these problems largely result from the configuration of the semiconductor device in which the self-aligned silicide regions are contacted directly by conductor layers forming contacts and interconnects for the device. The present invention contemplates provision of an improved salicide-configuration semiconductor device free from all these problems inherent in prior-art semiconductor devices fabricated by a known salicide process.

SUMMARY OF THE INVENTION

In accordance with one outstanding aspect of the present invention, there is provided a semiconductor device comprising (a) a layer of a metal silicide having a surface portion, and (b) a nitride layer forming the surface portion and consisting of a nitride of the metal silicide.

In accordance with another outstanding aspect of the present invention, there is provided a process of fabricating a semiconductor device, comprising the steps of (a) forming a layer of a metal silicide having a surface portion, and (b) nitriding the surface portion to form a nitride layer consisting of a nitride of the metal silicide.

In accordance with still another outstanding aspect of the present invention, there is provided a process of fabricating a semiconductor device, comprising the steps of (a) preparing a semiconductor substrate, (b) forming a layer of silicon in conjunction with the semiconductor substrate, (c) forming a layer of a metal on the layer of silicon, the metal silicide layer having a surface portion, and (d) heating the resultant structure in the presence of a reaction ambient containing nitride for forming on the layer of silicon a layer of a metal silicide having a surface portion and nitriding the surface portion to form a nitride layer consisting of a nitride of the metal silicide.

BRIEF DESCRIPTION OF THE DRAWINGS

The drawbacks of prior-art semiconductor devices with salisidce configurations and the features and advantages of a semiconductor device according to the present invention will be more clearly understood from the following description taken in conjunction with the accompanying drawings in which like reference numerals designate similar or corresponding layers, regions, portions and elements and in which.

DESCRIPTION OF THE PRIOR ART

Figure 1A:
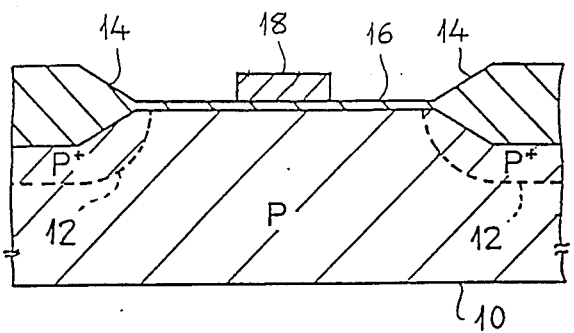
FIGS. 1A to 1F are fragmentary cross sectional views showing the successive steps used for fabricating a semiconductor device with salicide configuration by a known fabrication process.

Referring to FIGS. 1A to 1F, first to FIG. 1A, a known semiconductor device implementing an n-channel MOSFET with a salicide configuration may be fabricated from a p-type silicon substrate 10. After a thin oxide film (not shown) is thermally grown on the surface of the substrate 10, channel stopper regions 12 are formed selectively in the silicon substrate 10 by implant of an acceptor-type dopant such as, for example, boron to define an area over which an active transistor device is to be fabricated. A thick field oxide layer 14 is then formed on these channel stopper regions 12 in the silicon substrate 10 typically using a well known local-oxidation-of-silicon (LOCOS) technique. The thin oxide film overlying the region to form the active transistor device is then removed to allow the silicon substrate 10 to be exposed over the area within which the transistor device is to be fabricated. A fresh oxide film 16 is then formed on the entire surface of the substrate 10 typically by a thermal oxidation technique, covering the exposed area of the substrate 10. Polysilicon is then conformally deposited over the entire surface of the resultant semiconductor structure. The polysilicon layer thus formed on the substrate 10 is patterned and etched to form a polysilicon gate region 18 on the gate oxide layer 16.

Figure 1B:
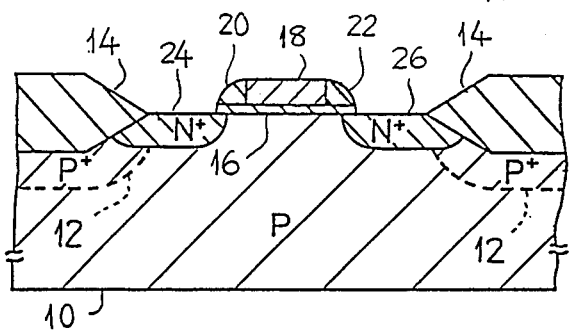

Turning to FIG. 1B, the thin oxide film 16 on the silicon substrate 10 is then selectively etched away to define the gate oxide region of the transistor to be formed. The polysilicon gate region 18 is patterned to leave the gate oxide layer 16 exposed adjacent the opposite side edges of the gate region 18. Another oxide layer is formed on the entire surface of the resultant structure typically by a chemical vapor deposition (CVD) technique and is etched by, for example, a reactive ion etching (RIE) technique to leave spacer filaments 20 and 22 on the side marginal portions of the gate oxide region 16 adjacent the opposite side edges of the polysilicon gate region 18. The polysilicon gate region 18 and the spacer filaments 20 and 22 thus formed on the gate oxide layer 16 are then used as a mask to inject a donor-type dopant such as phosphorus into the substrate 10 to form two self-aligned n-type doped regions 24 and 26 to provide the source/drain regions, respectively, of the transistor to be fabricated.

Figure 1C:
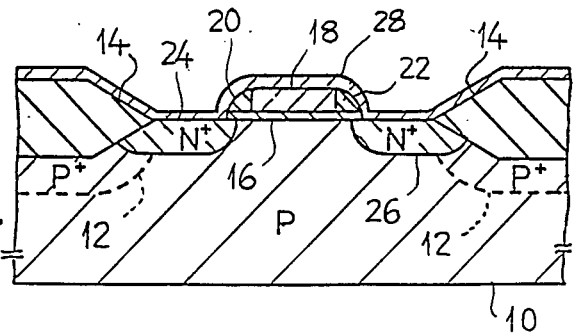
Figure 1D:
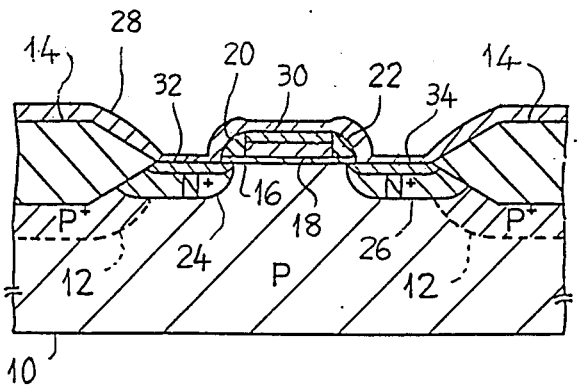

A layer 28 of a refractory metal such as typically titanium is then formed by sputtering on the entire surface of the resultant semiconductor structure as shown in FIG. 1C. The semiconductor structure thus coated with the refractory metal layer 28 is subjected to high-temperature annealing treatment in the presence of an inert-gas ambient of an atmospheric pressure (of about 760 Torr) within an electric furnace or by the use of a halogen lamp annealer (not shown). As a result of this high-temperature annealing treatment, alloying reaction takes place between the refractory metal layer 28 and the silicon forming the gate region 18 and n-type doped regions 24 and 26 so that metal silicide layers 30, 32 and 34 are formed on the regions 18, 24 and 26, respectively, as shown in FIG. 1D.

Figure 1E:
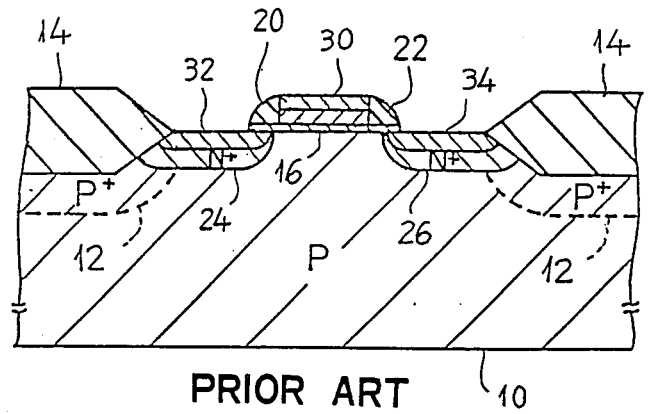
Figure 1F:
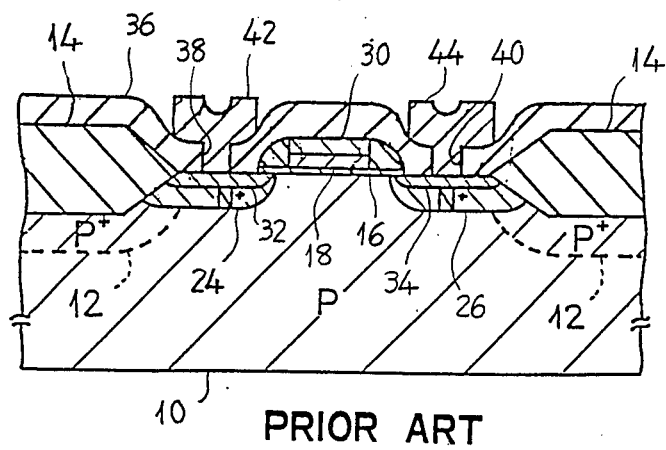

The refractory metal layer 28 remaining intact is then etched away using liquid ammonia as an etchant to allow the metal silicide layers 30, 32 and 34 to be exposed as shown in FIG. 1E. The resultant slice is annealed at a temperature higher than 700° C. for the purpose of stabilizing the crystalline structure of the metal silicide ($TiSi_2$) forming these layers 30, 32 and 34. Thereafter, an insulator layer 36 of, for example, phospho-silicate glass (PSG) is deposited on the entire surface of the resultant semiconductor structure as shown in FIG. 1F. The insulator layer 36 is selectively etched away to provide contact holes 38 and 40 extending to the surfaces of the metal silicide layers 32 and 34 overlying the n-type doped regions 24 and 26, respectively. A conductive layer of, for example, aluminum or an aluminum-based alloy is then formed by sputtering and is patterned and etched to provide contacts and interconnect lines including contacts 42 and 44 extending through the contact holes 38 and 40 to the surfaces of the metal silicide layers 32 and 34, respectively, as shown.

Various tests and experiments have been conducted with semiconductor devices fabricated using the process hereinbefore described. These tests and experiments have revealed that there are some important problems inherent in such semiconductor devices.

It has first been observed that a spurious film is formed at the interface between each of the titanium metal silicide layers 32 and 34 and each of the contacts 42 and 44, respectively, of aluminum or aluminum-based alloy. This film is produced by the reaction between titanium silicide and aluminum and is heterogeneous to both of metal silicide and aluminum or aluminum alloy. The spurious film causes variation in the contact resistance at the interface between metal silicide and aluminum or aluminum-based alloy and results in deterioration in the performance reliability of the resultant semiconductor device. Another problem is that the direct contact between metal silicide and aluminum as in the semiconductor device of the configuration shown in FIG. 1F tends to cause electromigration of aluminum. As well known in the art, electromigration is observed as a material transport of a conductor and occurs by the transfer of momentum from the electrons to cause a void or break in the conductor which may be a contact or an interconnect line. It may be further pointed out that metal silicide is more or less liable to be oxidated while it is being formed. This also causes variation in the contact resistance at the interface between metal silicide and aluminum or aluminum-based alloy and, again, results in deterioration in the performance reliability of semiconductor device.

As previously noted, the present invention aims at resolution of all these problems inherent in prior-art semiconductor devices of the described character.

DESCRIPTION OF THE PREFERRED EMBODIMENTS

Figure 2:
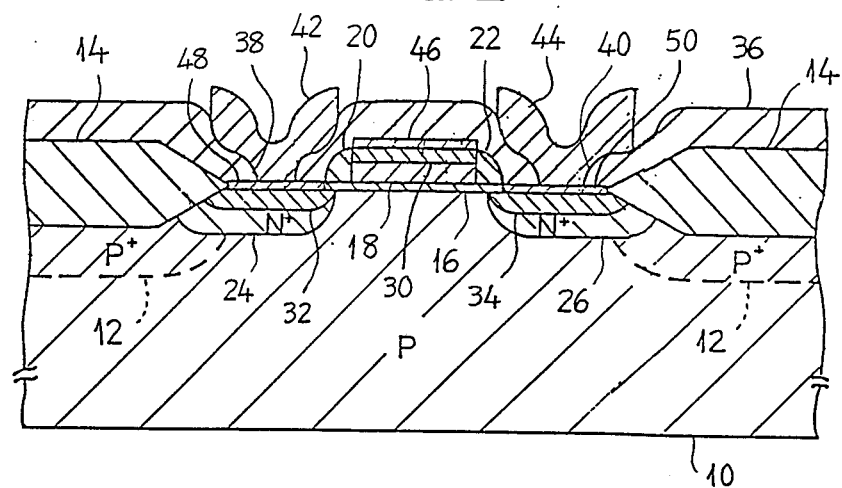
FIG. 2 is a fragmentary cross sectional view showing the sectional configuration of a preferred embodiment of a semiconductor device according to the present invention as viewed along one sectional plane of the device structure.
Figure 3:
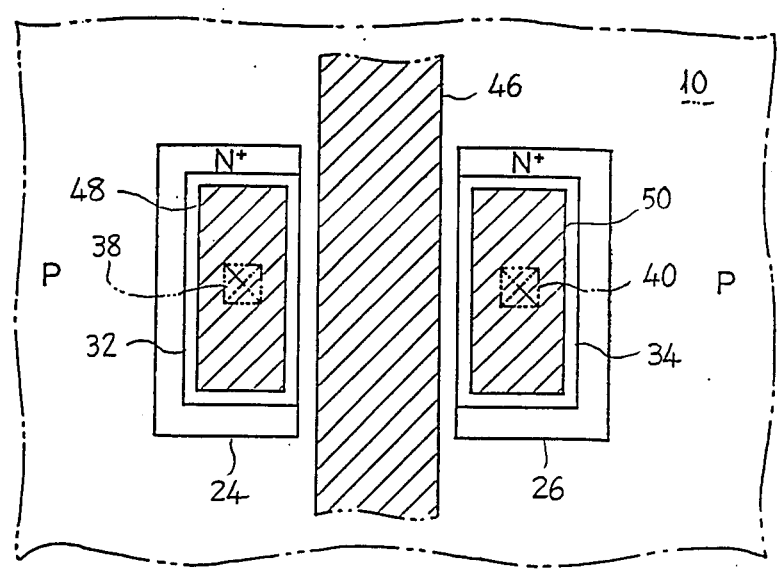
FIG. 3 is a plan view of the semiconductor device illustrated in FIG. 2, with the top level insulator layer of the device omitted from the illustration.

FIGS. 2 and 3 show the configuration of a preferred embodiment of a semiconductor device according to the present invention. The semiconductor device herein shown is fabricated in the form of a MOSFET device which is to implement a memory cell of a dynamic RAM device.

The shown semiconductor device embodying the present invention comprises a p-type silicon substrate 10 having channel stopper regions 12 and a thick LOCOS field oxide layer 14 overlying the channel stopper regions 12. The field oxide layer 14 is patterned to define the area of the shown MOS transistor device. A gate oxide layer 16 is formed on this area of the silicon substrate 10 and is overlain by a polysilicon gate region 18 which intervenes between spacer filaments 20 and 22 of silicon dioxide formed on the gate oxide region 16 adjacent the opposite side edges of the polysilicon gate region 18. A pair of self-aligned n-type doped source/drain regions 24 and 26 are formed in the silicon substrate 10. One of these source/drain regions 24 and 26 extends from the vicinity of one side edge of the gate oxide region 16 and terminates in one of the channel stopper regions 12 and the other source/drain region extends from the vicinity of the other side edge of the gate oxide region 16 and terminates in the other channel stopper region 12, thus defining a channel region between the two source/drain regions 24 and 26.

The polysilicon gate region 18 has a surface portion formed by a metal silicide region 30 and, likewise, the n-type source/drain regions 24 and 26 have surface portions formed by metal silicide regions 32 and 34, respectively. In accordance with the present invention, these metal silicide regions 30, 32 and 34 are covered with thin regions 46, 48 and 50, respectively, of a nitride of metal silicide such as titanium silicide, of which the nitride regions 48 and 50 above the source/drain regions 24 and 26 are flush with the gate oxide region 16. As shown in FIG. 2, the semiconductor device embodying the present invention further comprises an insulator layer 36 of, for example, phospho-silicate glass covering the entire surface of the semiconductor structure and is formed with contact holes 38 and 40 extending to the surfaces of the nitride regions 48 and 50 above the source/drain regions 24 and 26, respectively. There are further provided contacts and interconnect lines of aluminum or an aluminum-based alloy (such as Al-Si) including contacts 42 and 44 extending through the contact holes 38 and 40 to the surfaces of the nitride regions 48 and 50, respectively, as shown. Typically, one of the contacts 42 and 44 is connected to a bit line and the other connected to ground across a capacitor in the dynamic RAM memory array including the shown semiconductor device as one of its memory cells.

As will be understood from the foregoing description, the semiconductor device embodying the present invention is characterized over the described prior-art semiconductor structure by the provision of the nitride regions 46, 48 and 50 overlying the metal, silicide regions 30, 32 and 34, respectively. Of these titanium-silicide nitride regions 46, 48 and 50, each of the regions 48 and 50 in the shown embodiment intervenes between each of the metal silicide regions 32 and 34 and each of the contacts 42 and 44, respectively, of aluminum or aluminum alloy. Thus, the titanium-silicide nitride regions 46, 48 and 50 physically isolate contacts 42 and 44 of aluminum or aluminum alloy from the metal silicide regions 32 and 34 on the source/drain regions 24 and 26, respectively and prevent aluminum from reacting with metal silicide during formation of the contacts 42 and 44. The resistance between the metal silicide and the aluminum or aluminum-based alloy therefore remains substantially unchanged and provides enhanced performance reliability of the resultant semiconductor device. It may be herein noted that a nitride of titanium silicide is normally low enough to range from about 13 ohms-cm to 16 ohms-cm and for this reason will not give rise to an increase in the contact resistance between the metal silicide and aluminum. The nitride regions 46, 48 and 50 provided in the semiconductor device embodying the present invention are further useful for the prevention of the oxidation of the underlying metal silicide regions 30, 32 and 34, respectively, and will again contribute to improvement in the performance reliability of the device.

Another important advantage which is achievable by the provision of the nitride regions 46, 48 and 50 on the metal silicide regions 30, 32 and 34 is that nitride per se is less liable to cause electromigration than aluminum. Thus, a semiconductor device according to the present invention suffers no such problems that would otherwise result from the direct contact between metal silicide and aluminum. The nitride regions 46, 48 and 50 provided in the described embodiment of a semiconductor device according to the present invention may be, in this sense, said to provide a migration barrier and further improves the performance reliability of the device.

In order that the nitride regions 46, 48 and 50 achieve these advantages, each of the metal silicide regions 30, 32 and 34 is preferably about 1200-Å including the thickness of the nitride region with the polysilicon gate region 18 formed to a thickness of about 4500-Å where titanium is used as the refractory metal.

Description will be hereinafter made with reference to FIGS. 4A to 4F in regard to a preferred example of a process of fabricating the semiconductor device constructed as hereinbefore described with reference to FIGS. 2 and 3.

Figure 4A:
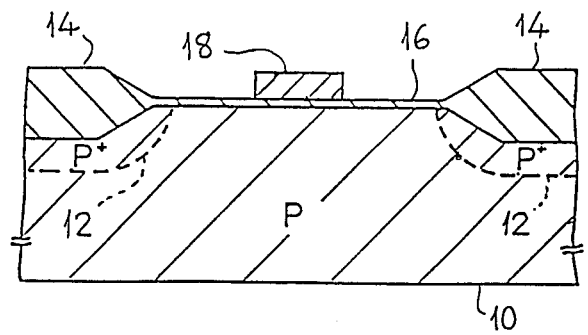
FIGS. 4A to 4F are fragmentary cross sectional views showing the successive steps used for fabricating the semiconductor device of FIGS. 2 and 3 by a fabrication process according to the present invention.

A p-type silicon substrate 10 may be used for the fabrication of such a semiconductor device as in the prior-art process described with reference to FIGS. 1A to 1F. Process steps similar to those described with reference to FIG. 1A are used to form channel stopper regions 12 and a thick field oxide layer 14 in this silicon substrate 10 as shown in FIG. 4A. A thin oxide film 16 is then deposited on the entire surface of the substrate 10 whereupon polysilicon is conformally deposited over the entire surface of the resultant semiconductor structure also in manners similar to those described with reference to FIG. 1A. The polysilicon layer thus formed on the substrate 10 is patterned and etched to form a polysilicon gate region 18 on the gate oxide layer 16 as shown in FIG. 4A. As noted previously, the polysilicon gate region 18 is formed preferably to a thickness of about 4500-Å.

Figure 4B:
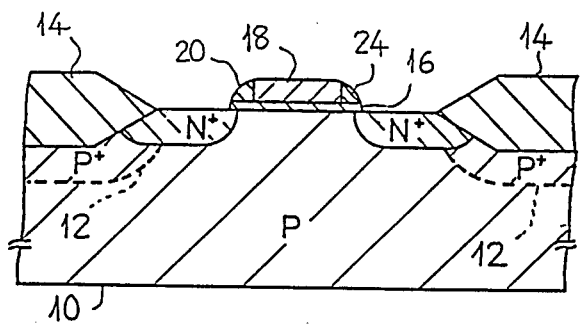
Figure 4C:
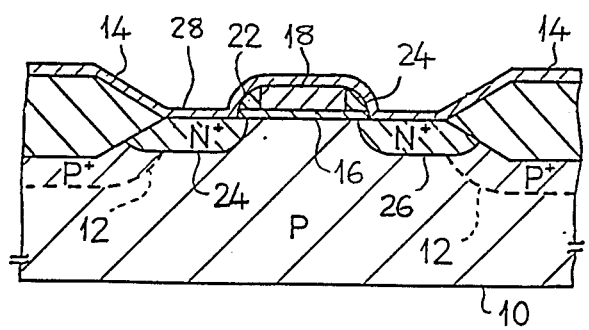
Figure 4D:
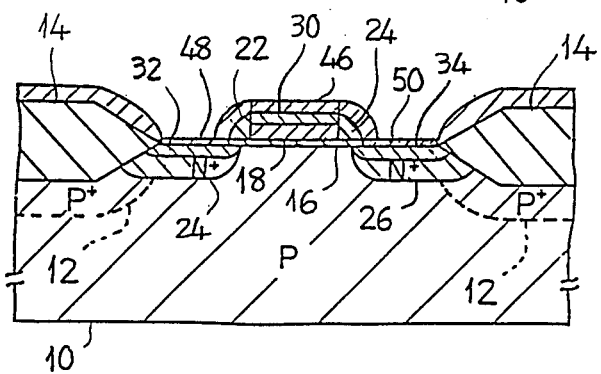

As shown in FIG. 4B, the thin oxide film 16 on the silicon substrate 10 is selectively etched away to define the gate oxide region of the transistor to be formed. Spacer filaments 20 and 22 are then formed on the side marginal portions of the gate oxide region 16 adjacent the opposite side edges of the polysilicon gate region 18, whereupon two self-aligned n-type doped regions 24 and 26. The steps to form these gate oxide region 16, spacer filaments 20 and 22 and doped regions 24 and 26 are also similar to those described with reference to FIG. 1B. A layer 28 of a refractory metal such as typically titanium is then formed on the entire surface of the resultant semiconductor structure as shown in FIG. 4C. Where titanium is used as a refractory metal, the refractory metal layer 28 is formed preferably to a thickness of about 1200-Å. The semiconductor structure thus coated with the refractory metal layer 28 is annealed to form metal silicide regions 30, 32 and 34 on the regions 18, 24 and 26, respectively, as shown in FIG. 4D. The annealing treatment may be performed in the presence of a reaction ambient such as a nitrogen gas or any nitrogen-containing gas (such as an ammonia gas) at a subatmospheric pressure (of about $10^{-2}$ Torr) within an electric furnace or by the use of a halogen lamp annealer (not shown) preferably at a temperature within the range of 550° C. to 600° C. While a silicide-forming reaction procedes at the interface between the refractory metal layer 28 and each of the polysilicon and doped silicon regions 18, 24 and 26, a nitriding reaction due to the nitrogen species in the reaction ambient takes place on or in the surface portion of the refractory metal layer 28 to form regions 46, 48 and 50 of a nitride of the refractory metal silicide on the refractory metal silicide regions 30, 32 and 34, respectively. The nitriding reaction controls the diffusion of silicon toward the surface of the metal layer 28 and extends into the underlying metal silicide regions 30, 32 and 34. Where titanium is used as the refractory metal, the thickness of each of the metal silicide regions 30, 32 and 34 is preferably about 1200-Å including the thickness of the nitride region 46, 48 or 50 with the polysilicon gate region 18 formed to a thickness of about 4500-Å. In this instance, each of the nitride region 46, 48 and 50 is formed preferably to a thickness of about 1000-Å. The nitriding reaction which proceeds concurrently with the silicide-forming reaction contributes to prevention of the oxidation of the silicide. The use of a subatmospheric pressure of the reaction ambient for the nitriding reaction is intended to enhance such an oxidation preventive effect of the nitriding reaction as will be readily understood by those skilled in the art.

Figure 4E:
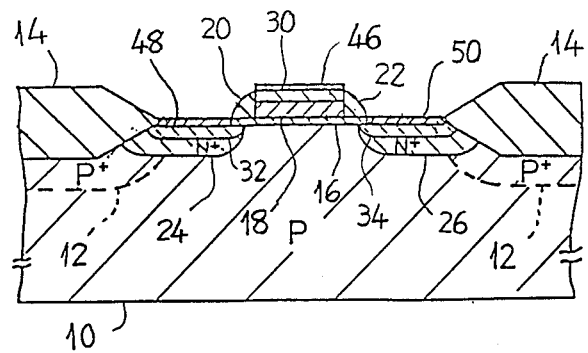

The refractory metal layer 28 remaining intact on the field oxide layer 14 and spacer filaments 20 and 22 is then etched away using liquid ammonia as an etchant. The nitride regions 46, 48 and 50 are thus exposed and are left to remain on and generally in registry with the underlying refractory metal silicide regions 30, 32 and 34, respectively, as shown in FIG. 4E. The resultant structure is annealed at a temperature higher than 700° C. in a nitrogen or nitrogen-containing ambient similar to the reaction ambient used for the nitriding reaction. As a result of this high-temperature annealing treatment, not only the crystalline structure of the metal silicide ($TiSi_2$) forming these regions 30, 32 and 34 is stabilized but also the nitriding reaction in the refractory metal silicide regions proceeds sufficiently in the presence of the nitrogen or nitrogen-containing ambient. The crystalline structure of the metal silicide thus stabilized by the annealing treatment contributes to improvement in the surface state of the crystalline structure which is free from the risk of being peeled off. Where one of the contacts 42 and 44 is connected to a bit line of the memory array as previously noted, a peel-off of the silicide region 32 or 34 would cause a critical damage to the memory array. Such a damage can however be effectively avoided through the high-temperature annealing treatment carried out under the conditions described.

Figure 4F:
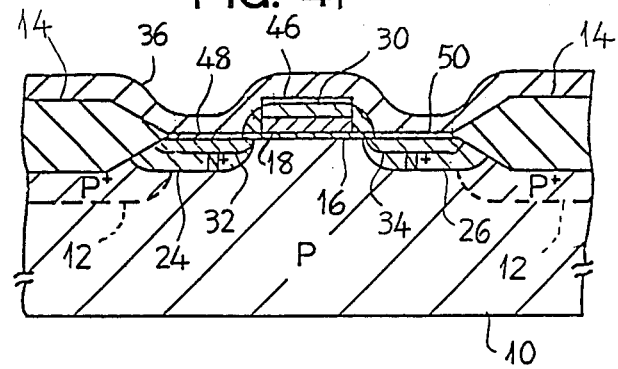

An insulator layer 36 of, for example, PSG is now deposited on the entire surface of the resultant semiconductor structure as shown in FIG. 4F and is selectively etched away to provide contact holes 38 and 40 (FIGS. 2 and 3) extending to the surfaces of the nitride regions 48 and 50 over the n-type doped regions 24 and 26, respectively. When in etching the insulator layer 36 to form these contact holes 38 and 40, the nitride regions 48 and 50 serve as masks to the bulk silicon of the substrate 10. A conductive layer of, for example, aluminum or an aluminum-based alloy is then formed by a known sputtering technique and is patterned and etched to provide contacts and interconnect lines including the contacts 42 and 44 extending through the contact holes 38 and 40 to the surfaces of the nitride regions 48 and 50, respectively, as shown in FIG. 2.

Figure 5:
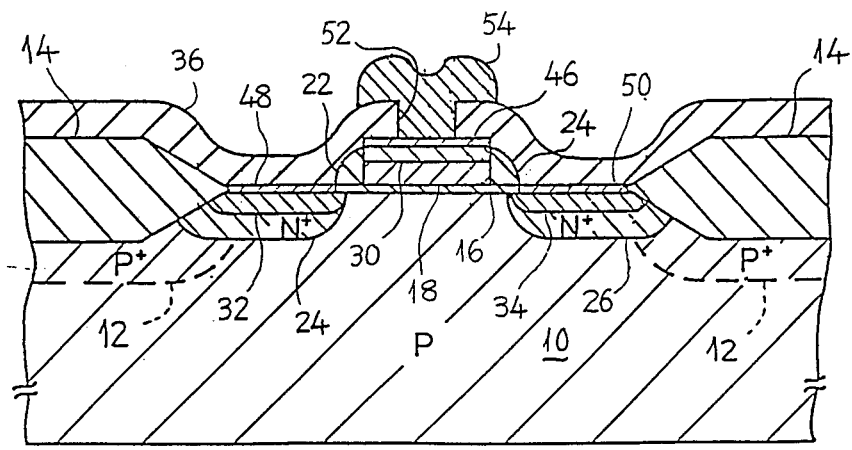
FIG. 5 is a view similar to FIG. 2 but shows the cross sectional configuration of the semiconductor device as viewed along another sectional plane of the device structure.

FIG. 5 shows the arrangement in which a contact is provided for the polysilicon gate region 18 of the semiconductor device shown in FIGS. 2 and 3. The insulator layer 36 is further formed with a contact hole 52 which is provided at any location off the cross sectional plane indicated in FIG. 2 and which extends to the surface of the nitride region 46 above the polysilicon gate region 18. A contact 54 of, for example, aluminum is provided in conjunction with this contact hole 52 and extends through the hole 52 to the surface of the nitride region 46, as shown. Not only the signal transmission efficiency of the semiconductor device thus increases due to the existence of the refractory metal silicide region 30 intervening between the polysilicon gate region 18 and the contact 54 but also the contact resistance of the contact 54 is reduced due to the existence of the nitride region 46 intervening between the contact 54 and the refractory metal silicide region 30. The contact 54 thus provided for the polysilicon gate region 18 is typically connected to a word line of the memory array.

While it has been assumed that the nitride regions 46, 48 and 50 are formed on or in the surface portions of the refractory metal silicide regions 30, 32 and 34, respectively, it is preferred that the second annealing treatment for the device be performed so that each of the nitride regions extends into each of the silicide regions. Furthermore, the refractory metal to be used for the formation of the refractory metal silicide regions 30, 32 and 34 may be implemented not by titanium but, if desired, by another type of refractory metal such as tungsten, molybdenum or tantalum. The contacts and interconnect lines for the device have been assumed to be of aluminum or an aluminum-based alloy such as Al-Si, it will be apparent that any other metallization material such as any of the above mentioned refractory metals may be used. While, on the other hand, the present invention has been described as being embodied in a semiconductor device having a multi-layer structure including the layers of refractory metal silicide and silicon, a nitride layer may be formed on the surface of a gate region consisting of a refractory metal silicide alone. It should further be borne in mind that the present invention, which has been hereinbefore described as being applied to a dynamic RAM device, is applicable to any other types of devices incorporated in a semiconductor integrated circuit in so far as the device has a refractory metal silicide layer or region.

What is claimed is:

1. A semiconductor device comprising
   (a) a layer of a metal silicide having a surface portion, and
   (b) a nitride layer forming said surface portion and consisting of a nitride of said metal silicide.

2. A process of fabricating a semiconductor device, comprising the steps of
   (a) forming a layer of a metal silicide having a surface portion, and
   (b) nitriding said surface portion to form a nitride layer consisting of a nitride of said metal silicide.

3. A process of fabricating a semiconductor device, comprising the steps of
   (a) preparing a semiconductor substrate,
   (b) forming a layer of silicon in conjunction with said semiconductor substrate,
   (c) forming a layer of a metal on said layer of silicon, the metal silicide layer having a surface portion, and
   (d) heating the resultant structure in the presence of a reaction ambient containing nitride for forming on said layer of silicon a layer of a metal silicide having a surface portion and nitriding said surface portion to form a nitride layer consisting of a nitride of said metal silicide.

4. A process as set forth in claim 3, wherein said structure is heated at a temperature within the range of from about 550° C. to about 600° C. at a subatmospheric pressure.

5. A process as set forth in claim 3, wherein said structure is heated at a temperature within the range of from about 550° C. to about 600° C. at a pressure of about $10^{-2}$ Torr.

6. A semiconductor device as set forth in claim 1, further including a semiconductor substrate, and said layer of a metal silicide being disposed over said semiconductor substrate.

7. A semiconductor device as set forth in claim 6, wherein a layer of polysilicon is interposed between said semiconductor substrate and said layer of a metal silicide so as to dispose said polysilicon layer over said semiconductor substrate, and said layer of a metal silicide on said polysilicon layer.

8. A semiconductor device as set forth in claim 6, further including a layer of doped silicon in said semiconductor substrate, said layer of a metal silicide being disposed on the layer of doped silicon.

9. A semiconductor device as set forth in claim 1, wherein said metal silicide layer has a thickness of about 1200-Å.

10. A semiconductor device as set forth in claim 7, wherein said polysilicon layer has a thickness of about 4500-Å and said metal silicide layer has a thickness of about 1200-Å.

11. A semiconductor device as set forth in claim 7, wherein said metal silicide layer has a thickness of about 1200-Å including the thickness of the nitride layer disposed thereon, and said polysilicon layer has a thickness of about 4500-Å.

12. A semiconductor device as set forth in claim 11, wherein said nitride layer has a thickness of about 1000-Å.

13. A process as set forth in claim 2, further including preparing a semiconductor substrate, and forming said layer of a metal silicide over said semiconductor substrate.

14. A process as set forth in claim 13, further including forming a layer of polysilicon over said semiconductor substrate prior to the formation of said layer of a metal silicide so as to position said layer of polysilicon between said semiconductor substrate and the subsequently formed said layer of a metal silicide.

15. A process as set forth in claim 13, further including forming a layer of doped silicon in said semiconductor substrate, and thereafter forming said layer of a metal silicide on said layer of doped silicon.

* * * * *